(12) United States Patent
Ozawa et al.

(10) Patent No.: US 7,339,257 B2
(45) Date of Patent: Mar. 4, 2008

(54) SEMICONDUCTOR DEVICE IN WHICH SEMICONDUCTOR CHIP IS MOUNTED ON LEAD FRAME

(75) Inventors: Isao Ozawa, Chigasaki (JP); Akihito Ishimura, Yokohama (JP); Yasuo Takemoto, Yokohama (JP); Tetsuya Sato, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 199 days.

(21) Appl. No.: 11/114,151

(22) Filed: Apr. 26, 2005

(65) Prior Publication Data

US 2005/0236698 A1 Oct. 27, 2005

(30) Foreign Application Priority Data

Apr. 27, 2004 (JP) ............................. 2004-131648
Feb. 1, 2005 (JP) ............................. 2005-025549

(51) Int. Cl.
*H01L 23/495* (2006.01)
(52) U.S. Cl. .............................. 257/666; 257/E23.039; 257/676; 257/686
(58) Field of Classification Search ........ 257/E23.039, 257/E23.052, 787, 666, 676, 686, 777, 668, 257/669, 670
See application file for complete search history.

(56) References Cited

U.S. PATENT DOCUMENTS

| | | | | |
|---|---|---|---|---|
| 4,937,656 | A | * | 6/1990 | Kohara ........................ 257/676 |
| 4,943,843 | A | * | 7/1990 | Okinaga et al. ............. 257/666 |
| 5,327,009 | A | * | 7/1994 | Igeta ........................... 257/666 |
| 5,461,255 | A | * | 10/1995 | Chan et al. .................. 257/672 |
| 5,585,668 | A | * | 12/1996 | Burns .......................... 257/676 |
| 5,596,225 | A | * | 1/1997 | Mathew et al. ............. 257/667 |
| 5,780,925 | A | * | 7/1998 | Cipolla et al. .............. 257/676 |
| 6,433,421 | B2 | * | 8/2002 | Masuda et al. ............. 257/723 |
| 6,437,449 | B1 | * | 8/2002 | Foster ......................... 257/777 |
| 6,445,603 | B1 | * | 9/2002 | Abedifard ................... 365/51 |
| 6,498,391 | B1 | * | 12/2002 | Huang et al. ............... 257/676 |

(Continued)

FOREIGN PATENT DOCUMENTS

| | | |
|---|---|---|
| JP | 4-302164 | 10/1992 |
| JP | 6-224362 | 8/1994 |
| JP | 2001-102515 | 4/2001 |
| JP | 2001-2173863 | 8/2001 |

OTHER PUBLICATIONS

U.S. Appl. No. 11/430,965, filed May 10, 2006, Ozawa.

*Primary Examiner*—Kenneth Parker
*Assistant Examiner*—Chris C. Chu
(74) *Attorney, Agent, or Firm*—Oblon, Spivak, McClelland, Maier & Neustadt, P.C.

(57) ABSTRACT

A lead frame has a plurality of first inner leads having distal end portions and parallel to each other, and a plurality of second inner leads having distal end portions opposing the distal end portions of the first inner leads, longer than the first inner leads, and parallel to each other. The semiconductor chip has a plurality of bonding pads arranged along one side of an element formation surface, and is mounted on the surfaces of the plurality of second inner leads using an insulating adhesive. The plurality of bonding wires include first bonding wires which electrically connect the distal end portions of the plurality of first inner leads to some of the plurality of bonding pads, and a plurality of second bonding wires which electrically connect the distal end portions of the plurality of second inner leads to the rest of the plurality of bonding pads.

18 Claims, 12 Drawing Sheets

U.S. PATENT DOCUMENTS 7,084,490 B2 * 8/2006 Corisis ....................... 257/670
7,114,659 B2 * 10/2006 Harari et al. ............... 235/492
2003/0029920 A1 * 2/2003 Chhor et al. ................ 235/492
2005/0236698 A1 10/2005 Ozawa et al.

* cited by examiner

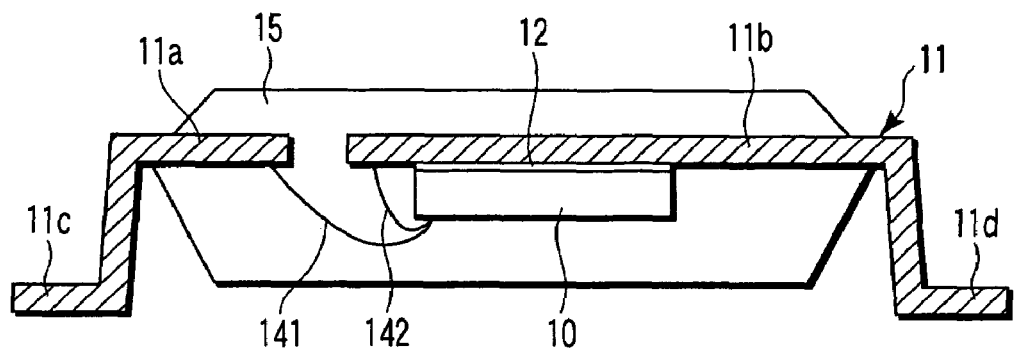
F I G. 15
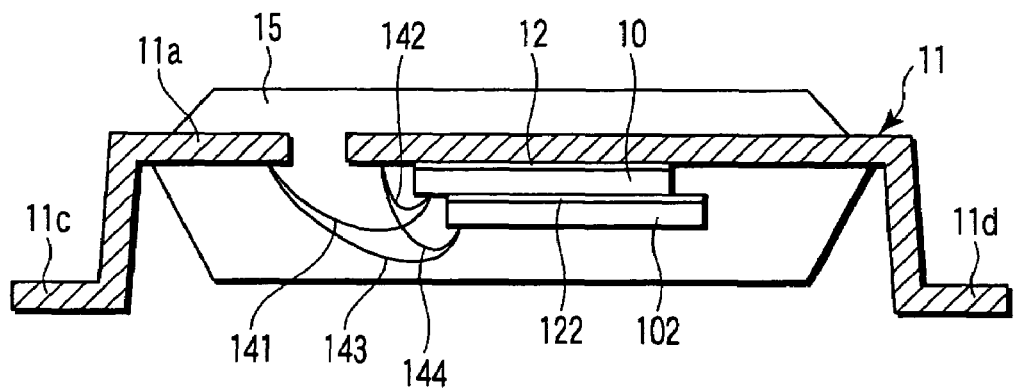
F I G. 16
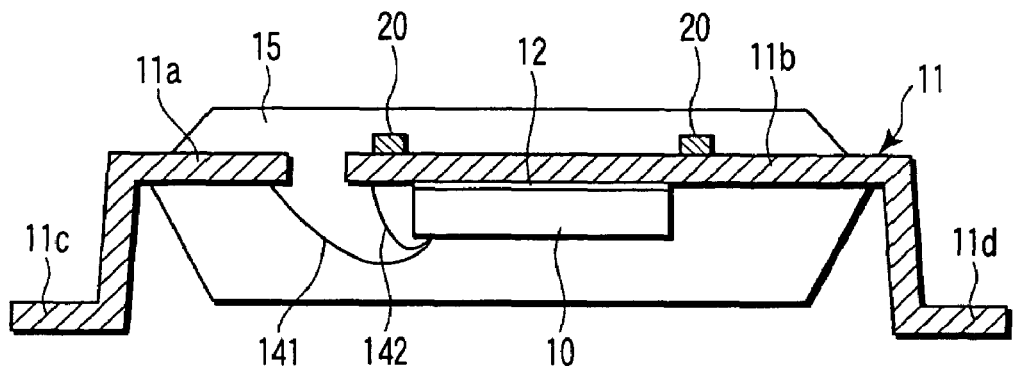
F I G. 17

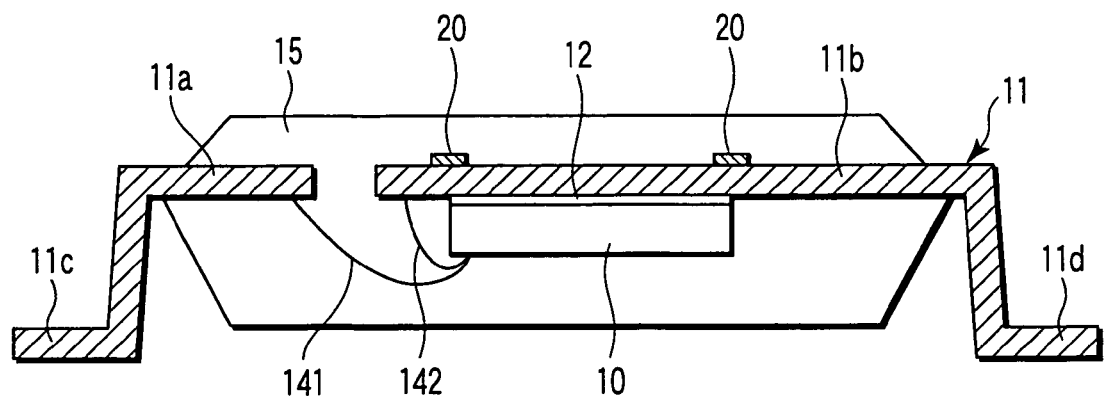
F I G. 18
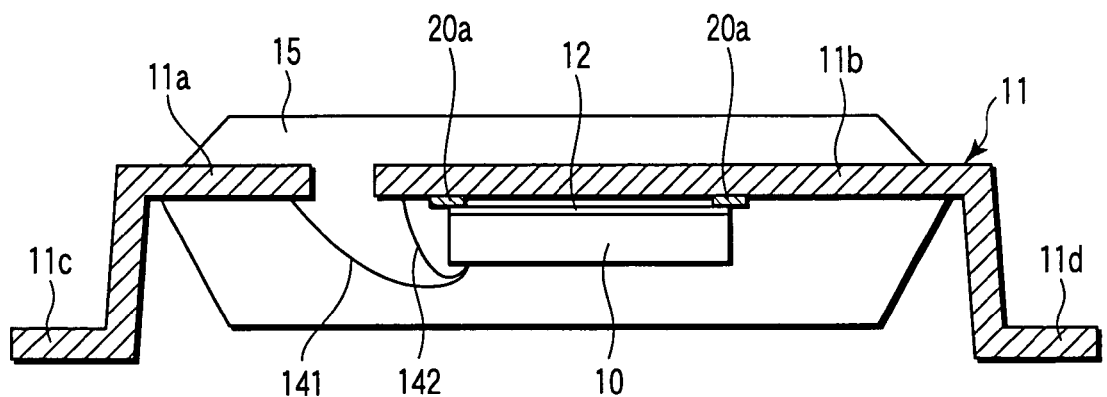
F I G. 19
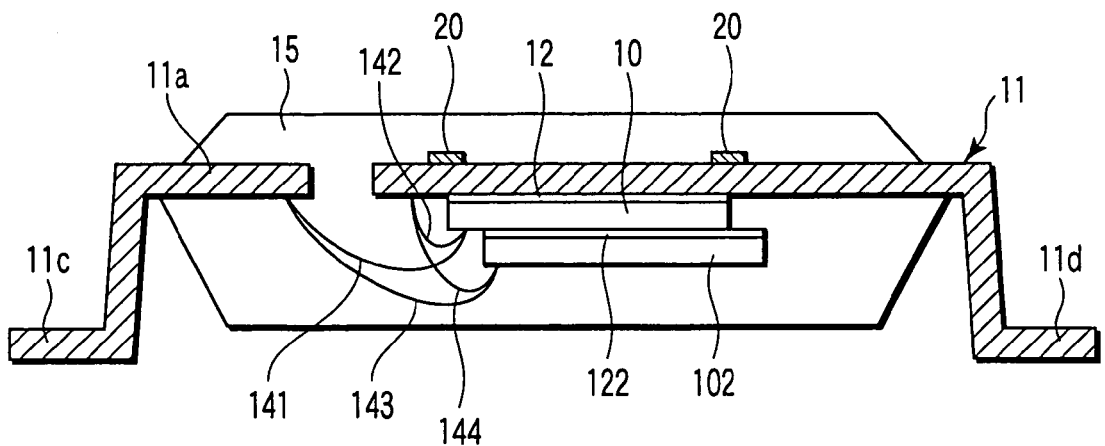
F I G. 20

SEMICONDUCTOR DEVICE IN WHICH SEMICONDUCTOR CHIP IS MOUNTED ON LEAD FRAME

CROSS-REFERENCE TO RELATED APPLICATIONS

This application is based upon and claims the benefit of priority from prior Japanese Patent Applications No. 2004-131648, filed Apr. 27, 2004; and No. 2005-025549, filed Feb. 1, 2005, the entire contents of both of which are incorporated herein by reference.

BACKGROUND OF THE INVENTION

1. Field of the Invention

The present invention relates to a semiconductor device in which a semiconductor chip is mounted on a lead frame, and bonding pads on the semiconductor chip and leads of the lead frame are electrically connected by bonding wires.

2. Description of the Related Art

A semiconductor chip having a ball grid array (BGA) structure using a semiconductor chip on which all pads are arranged along only one side of the chip is described, e.g., on pages 4 and 5 and FIG. 1 of Jpn. Pat. Appln. KOKAI Publication No. 2001-102515. In this semiconductor device, a semiconductor chip having a plurality of pads formed on only one side of the chip is prepared, and this semiconductor chip is stacked, as it is slightly shifted, on another semiconductor chip. This reduces the package size and facilitates wire bonding.

However, the following problem arises if a semiconductor chip having a plurality of pads formed only on one side of the chip is applied to a semiconductor device having a TSOP (Thin Small Outline Package) structure.

In the TSOP-structure semiconductor device, a semiconductor chip is fixed on die pads of a lead frame via an insulating adhesive. Also, a pair of inner lead groups of the lead frame and pads on the semiconductor chip are electrically connected by bonding wires. If a semiconductor chip having pads formed only on one side of the chip is used, one inner lead group is close to the pads, and the other is far from them. The bonding wire length extremely increases when the inner lead group far from the pads is connected to them by bonding wires. Therefore, in a resin encapsulation step performed later, the wires are readily carried away by a resin. Adjacent wires are likely to undergo short-circuiting.

Jpn. Pat. Appln. KOKAI Publication No. 2001-217383 discloses a semiconductor device that comprises a substrate and two identical semiconductor chips. Each chip has bonding pads provided on one edge of a major surface. The chips are laid, one upon the other, on the substrate. The chips are oriented in the same direction, and the bonding pads of one chip are therefore located near those of the other chip.

BRIEF SUMMARY OF THE INVENTION

According to an aspect of the present invention, there is provided a semiconductor device comprising a lead frame having at least a plurality of first inner leads having distal end portions and parallel to each other, and a plurality of second inner leads having distal end portions opposing the distal end portions of the first inner leads, longer than the first inner leads, and parallel to each other, a semiconductor chip having an element formation surface and a plurality of bonding pads arranged along one side of the element formation surface, and mounted on surfaces of the plurality of second inner leads via an insulating adhesive, a plurality of first bonding wires which electrically connect the distal end portions of the plurality of first inner leads to some of the plurality of bonding pad, and a plurality of second bonding wires which electrically connect the distal end portions of the plurality of second inner leads to the rest of the plurality of bonding pads.

BRIEF DESCRIPTION OF THE SEVERAL VIEWS OF THE DRAWING

FIG. 15 is a sectional view of a semiconductor device according to the sixth embodiment of the invention;

FIG. 16 is a sectional view of a semiconductor device according to the seventh embodiment of this invention;

FIG. 17 is a sectional view of a semiconductor device according to the eighth embodiment of the invention;

FIG. 18 is a sectional view of a semiconductor device that is a first modification of the eighth embodiment;

FIG. 19 is a sectional view of a semiconductor device that is a second modification of the eighth embodiment;

FIG. 20 is a sectional view of a semiconductor device according to the ninth embodiment of the present invention;

DETAILED DESCRIPTION OF THE INVENTION

First Embodiment

Figure 1:
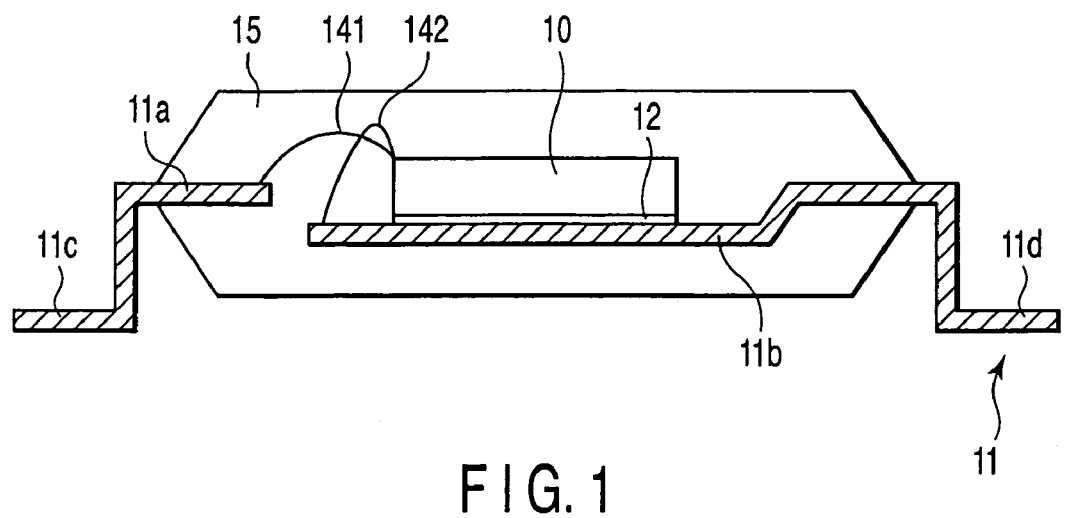
FIG. 1 is a sectional view of a semiconductor device according to the first embodiment of the present invention.
Figure 2:
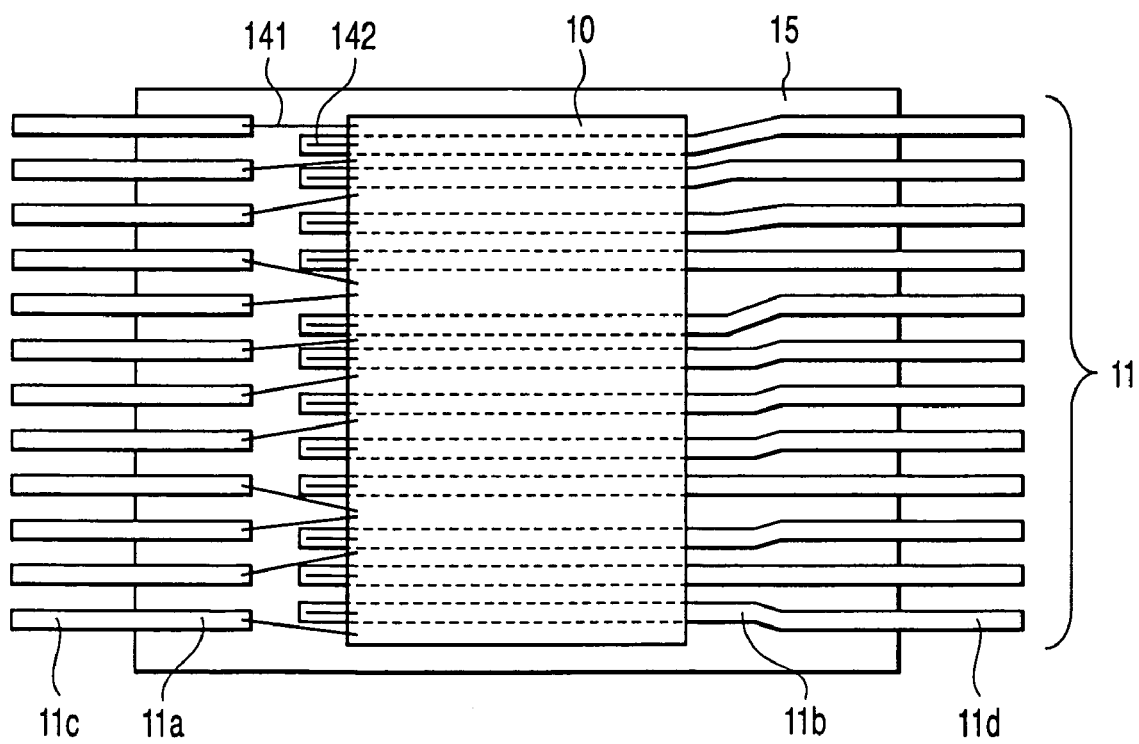
FIG. 2 is a partially perspective plan view of the semiconductor device shown in FIG. 1.
Figure 3A:
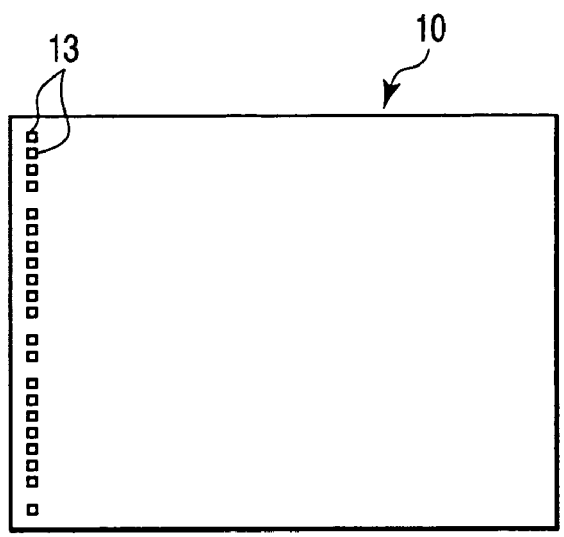
FIG. 3A is a plan view of a semiconductor chip in the semiconductor device shown in FIG. 1.
Figure 3B:
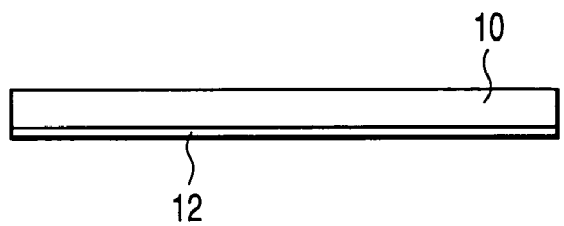
FIG. 3B is a side view of the semiconductor chip in the semiconductor device shown in FIG. 1.

FIG. 1 is a sectional view of a semiconductor device having a TSOP structure according to the first embodiment of the present invention. FIG. 2 is a partially perspective plan view of the semiconductor device shown in FIG. 1. FIGS. 3A and 3B are a plan view and side view, respectively, of a semiconductor chip used in the semiconductor device shown in FIG. 1.

As shown in FIG. 2, a lead frame 11 has a first inner lead group, second inner lead group, first outer lead group, second outer lead group, and suspension pins (not shown). The first inner lead group has a plurality of first inner leads 11a arranged parallel to each other. The second inner lead group has a plurality of second inner leads 11b having distal end portions opposing the distal end portions of the first inner leads, and arranged parallel to each other. The first outer lead group has a plurality of first outer leads 11c integrated with the inner leads 11a of the first inner lead group. The second outer lead group has a plurality of second outer leads 11d integrated with the inner leads 11b of the second inner lead group. The length of each first inner lead 11a in the first inner lead group is different from that of each second inner lead 11b in the second inner lead group. More specifically, the length of each of the second inner leads 11b is longer than that of each of the first inner leads 11a. As shown in FIG. 1, the second inner leads 11b having a long length are bent halfway such that a plane formed by the upper surfaces of the second inner leads 11b as semiconductor chip mounting surfaces is lower than a plane formed by the upper surfaces of the first inner leads 11a. Portions, e.g., central portions of the second inner leads 11b are used as die lead portions for mounting a semiconductor chip 10, i.e., as chip mounting portions.

As shown in FIG. 3A, a plurality of bonding pads 13 are arranged along one side of the element formation surface of the semiconductor chip 10. Also, as shown in FIG. 3B, a thin, e.g., 20- to 40-μm thick organic insulating film, for example, an adhesive 12 made of a polyimide-based epoxy resin is adhered to the lower surface of the semiconductor chip 10. The semiconductor chip 10 is mounted on the die lead portions of the second inner leads 11b via the organic insulating film 12. The bonding pads 13 of the semiconductor chip 10 oppose the first inner leads 11a, i.e., inner leads on which the semiconductor chip 10 is not mounted, and which have a short length. In other words, the first inner leads 11a having a short length are so arranged that their distal end portions oppose the bonding pads 13. The second inner leads 11b having a long length extend below the lower surface of the chip such that their distal end portions extend from the chip 10 and the distal end portions of the second inner leads 11b are positioned between the first inner leads 11a and the bonding pads 13.

The organic insulating film 12 is used to increase the insulating properties between the chip lower surface and die lead portions. As the organic insulating film 12, it is also possible to use a film-like insulating adhesive which is adhered to the lower surface of a wafer in advance, and remains on the chip lower surface in a dicing step in which chips are separated from the wafer.

The distal end portions of the first inner leads 11a on which the chip 10 is not mounted and some of the bonding pads 13 on the chip 10 are electrically connected by a plurality of first bonding wires 141. The distal end portions of the second inner leads 11b on which the chip 10 is mounted and the rest of the bonding pads 13 on the chip 10 are electrically connected by a plurality of second bonding wires 142.

A package 15 is formed by encapsulating, with a resin, the first and second inner leads 11a and 11b of the lead frame 11, the semiconductor chip 10, and the first and second boding wires 141 and 142.

The first and second outer leads 11c and 11d integrated with the first and second inner leads 11a and 11b, respectively, are extended outward from at least a pair of opposing sides of the package 15, and used as external terminals.

The semiconductor device shown in FIGS. 1, 2, 3A and 3B has a COL (Chip On Lead) structure in which the semiconductor chip 10 is mounted on the second inner leads 11b, and the distal end portions of the first and second inner leads 11a and 11b are electrically connected to the bonding pads 13 on the semiconductor chip 10 by the first and second bonding wires 141 and 142, respectively.

In-addition, the bonding pads 13 on the semiconductor chip 10 are connected by wire bonding to the distal end portions of the first and second inner leads 11a and 11b positioned close to the bonding pads 13. That is, the bonding pads 13 of the semiconductor chip 10 are connected on the side along which they are arranged. Therefore, the bonding wire length can be decreased. As a consequence, when resin encapsulation is performed after the wire bonding step, it is possible to prevent bonding wires from being carried away by the flowing resin, or prevent short circuits between adjacent wires. This improves the reliability.

Also, the semiconductor chip 10 is adhered on the die lead portions by the thin insulating adhesive 12 on the lower surface of the semiconductor chip 10. This is suited to the TSOP structure, and makes it possible to decrease the differences between the height of the chip upper surface and the heights of the distal end portions of the first and second inner leads 11a and 11b, and to facilitate the wire bonding step.

Of the bonding pads 13 on the semiconductor chip 10, I/O pads for inputting and outputting signals are connected by wire bonding to the distal end portions of the first inner leads 11a and the second inner leads 11b.

Second Embodiment

Figure 4:
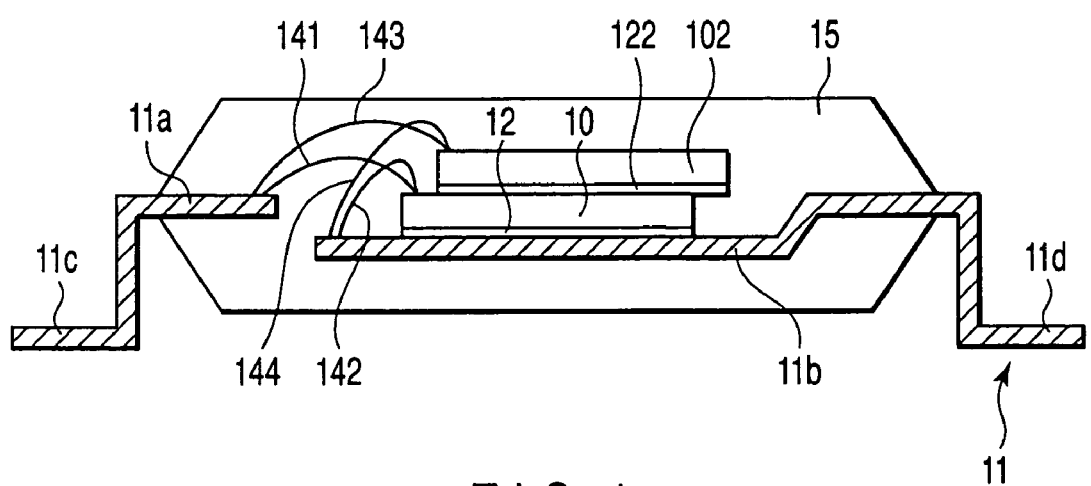
FIG. 4 is a sectional view of a semiconductor device according to the second embodiment of the present invention.

FIG. 4 is a sectional view schematically showing a semiconductor device having a TSOP structure according to the second embodiment of the present invention. This semiconductor device shown in FIG. 4 differs from the semiconductor device of the first embodiment described above in that two semiconductor chips 10 and 102 of the same type and/or the same size, in each of which a plurality of bonding pads are collectively arranged on one side of the chip, are stacked via an insulating adhesive 122 such that their pad arrangement portions are close to each other, and their plane positions are shifted from each other. Since the rest of the structure is the same, the same reference numerals as in FIG. 1 denote the same parts.

Referring to FIG. 4, the first semiconductor chip 10 having a plurality of first bonding pads (equivalent to 13 in FIG. 3A) is mounted, via a thin organic insulating film 12 on the lower surface of the chip and via a common mounting agent, on die lead portions of a plurality of long second inner leads 11b of a lead frame 11. The second semiconductor chip 102 has a plurality of second bonding pads (equivalent to 13 in FIG. 3A) arranged along one side of the element formation surface. The second semiconductor chip 102 is stacked on the element formation surface of the first semiconductor chip 10 via the insulating adhesive 122, such that the positions of the second bonding pads are shifted from the first bonding pads in a direction parallel to the direction in which the first and second bonding pads are arranged, and the first bonding pads are exposed. First inner leads 11a and the second inner leads 11b are electrically connected to the first and second bonding pads on the first and second semiconductor chips 10 and 102 by a plurality of bonding wires. These bonding wires are divided into four groups.

A first bonding wire group made up of a plurality of first bonding wires 141 electrically connects the distal end portions of some of the first inner leads 11a to some of the first bonding pads on the first semiconductor chip 10. A second bonding wire group made up of a plurality of second bonding wires 142 electrically connects the distal end portions of some of the second inner leads 11b, on which the first semiconductor chip 10 is mounted, to the rest of the first bonding pads on the first semiconductor chip 10. A third bonding wire group made up of a plurality of third bonding wires 143 electrically connects the distal end portions of the rest of the first inner leads 11a to some of the second bonding pads on the second semiconductor chip 102. A fourth bonding wire group made up of a plurality of fourth bonding wires 144 electrically connects the distal end portions of the rest of the second inner leads 11b to the rest of the second bonding pads on the second semiconductor chip 102.

A resin package 15 is formed by encapsulating, with a resin, the first and second inner leads 11a and 11b of the lead frame 11, the insulating adhesives 12 and 122, the semiconductor chips 10 and 102, and the first to fourth bonding wires 141 to 144. A plurality of first outer leads 11c and a plurality of second outer leads 11d integrated with the first and second inner leads 11a and 11b, respectively, are extended outward from at least a pair of opposing sides of the package 15. The first and second outer leads 11c and 11d are used as external terminals.

The semiconductor device shown in FIG. 4 has a COL structure, and achieves the same effects as in the first embodiment described earlier. That is, the first and second bonding pads on the two semiconductor chips 10 and 102 are electrically connected by wire bonding to the distal end portions of the first and second inner leads 11a and 11b positioned close to these bonding pads. Therefore, the bonding wire length can be decreased. As a consequence, when resin encapsulation is performed after the wire bonding step, it is possible to prevent bonding wires from being carried away by the flowing resin, or prevent short-circuits between adjacent wires. This improves the reliability. Also, the first semiconductor chip 10 is adhered on the second inner leads 11b by the thin insulating adhesive 12 on the lower surface of the chip. This is suited to the TSOP structure, and makes it possible to decrease the differences between the height of the chip upper surface and the heights of the first and second inner leads 11a and 11b, and to facilitate the wire bonding step. Furthermore, since the semiconductor chips are stacked, a high-density package can be obtained.

Third Embodiment

The third embodiment differs from the semiconductor device of the first embodiment in that lead fixing tapes 20 having an insulating adhesive are used to prevent relative positional differences between a plurality of second inner leads 11b, and the contact of these leads near their distal end portions.

Figure 5:
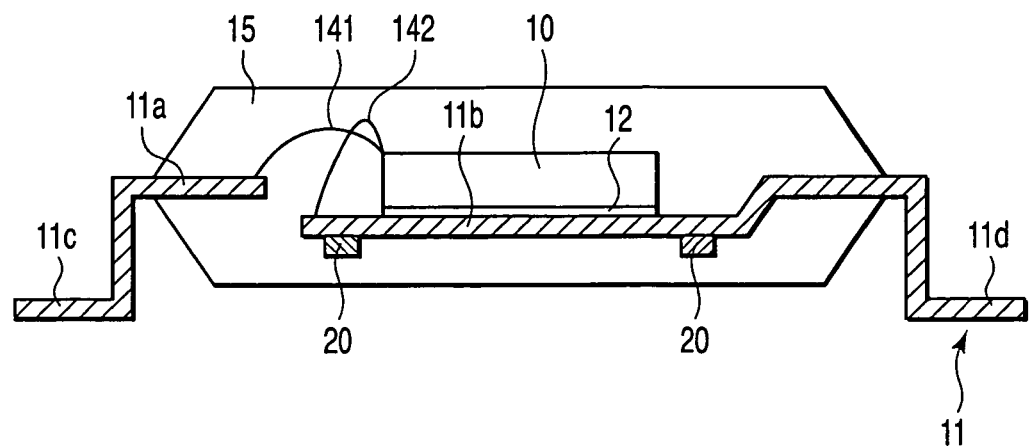
FIG. 5 is a sectional view of a semiconductor device according to the third embodiment of the present invention.
Figure 6:
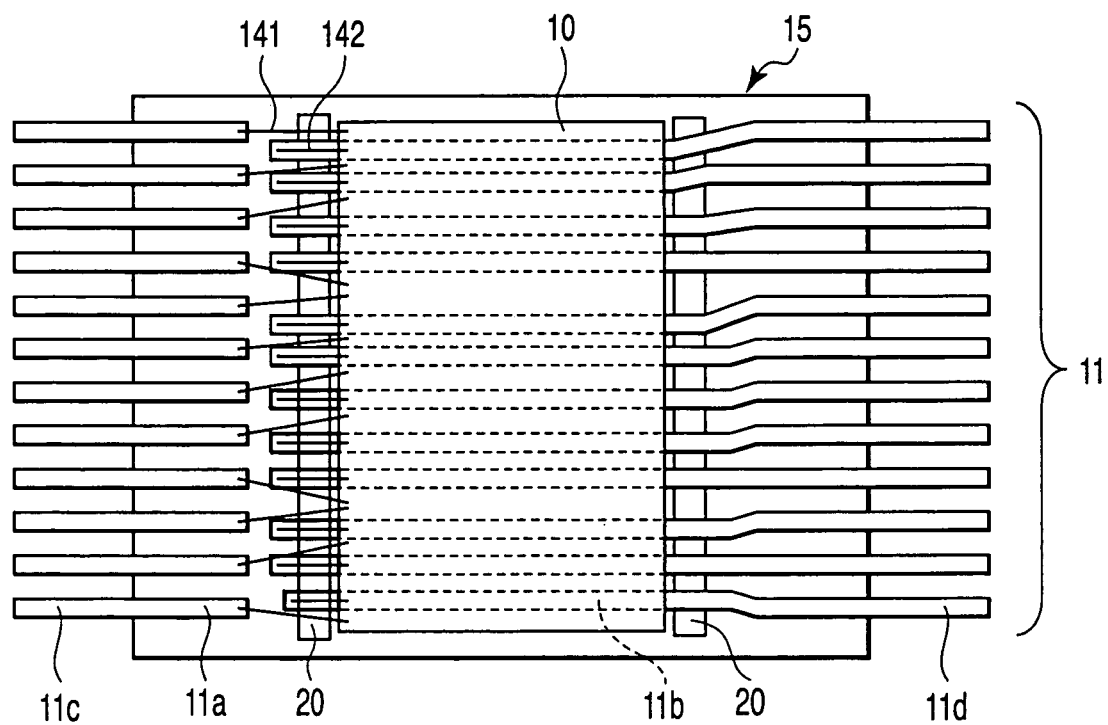
FIG. 6 is a partially perspective plan view of the semiconductor device shown in FIG. 5.

FIG. 5 is a sectional view schematically showing a semiconductor device having a TSOP structure according to the third embodiment of the present invention. FIG. 6 is a partially perspective plan view schematically showing the semiconductor device shown in FIG. 5.

This semiconductor device shown in FIGS. 5 and 6 differs from the semiconductor device of the first embodiment in that a pair of lead fixing tapes 20, e.g., polyimide tapes having an insulating adhesive are adhered to the lower surfaces of a plurality of second inner leads 11b on the two sides of a chip in a direction perpendicular to the longitudinal direction of the second inner leads 11b, i.e., so as to extend across the second inner leads 11b. Since the rest of the structure is the same, the same reference numerals as in FIGS. 1, 2, 3A and 3B denote the same parts.

The COL-structure semiconductor device shown in FIGS. 5 and 6 achieves the same effects as in the first embodiment. In addition, the pair of tapes 20 themselves are stably fixed on the lead frame, and the second inner leads 11b having a long length are fixed by the pair of tapes 20. This makes it possible to prevent relative positional differences between the second inner leads 11b, and the contact of these leads near their distal end portions. To stably connect by wire bonding, at least one lead fixing tape 20 is preferably positioned below portions near the distal end portions of the second inner leads 11b.

First Modification of Third Embodiment

Figure 7:
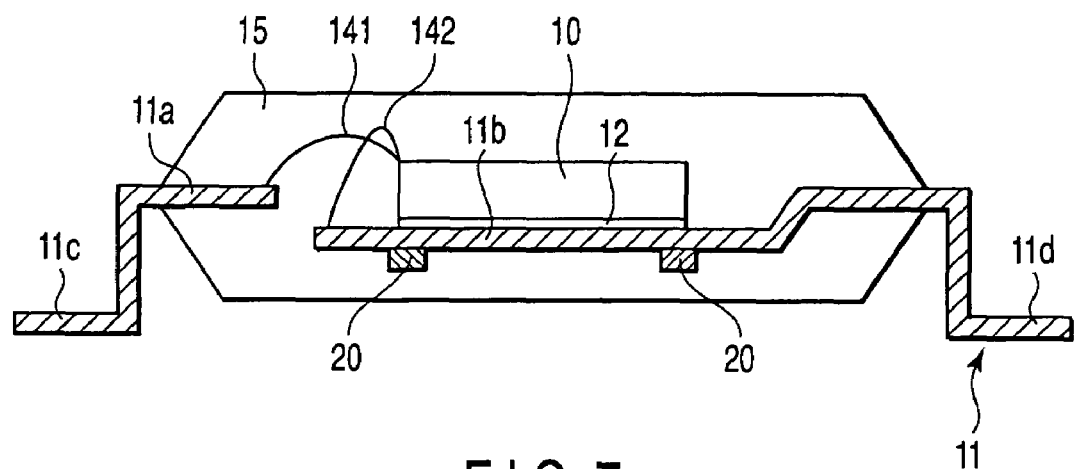
FIG. 7 is a sectional view of a semiconductor device according to the first modification of the third embodiment of the present invention.
Figure 8:
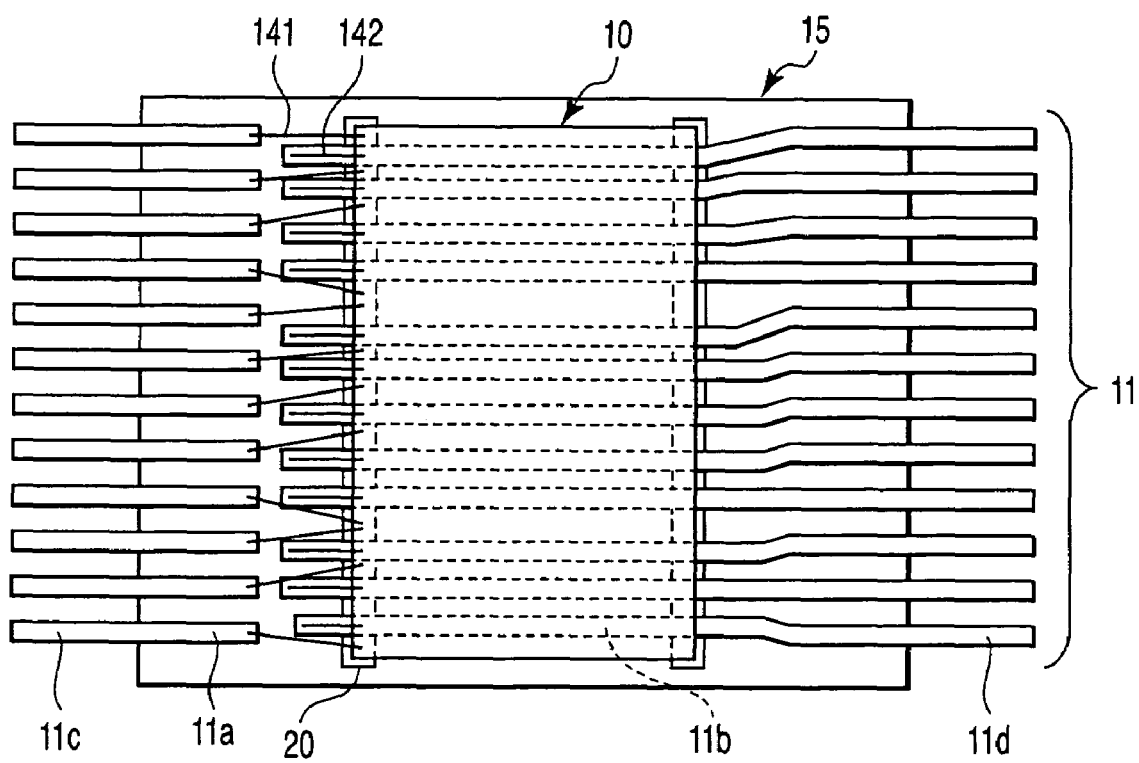
FIG. 8 is a partially perspective plan view of the semiconductor device shown in FIG. 7.

FIG. 7 is a sectional view schematically showing a semiconductor device having a TSOP structure according to the first modification of the third embodiment. FIG. 8 is a partially perspective plan view schematically showing the semiconductor device shown in FIG. 7.

This semiconductor device shown in FIGS. 7 and 8 differs from the third embodiment described above in the following respects. That is, a pair of lead fixing tapes 20 are adhered in a direction perpendicular to the longitudinal direction of a plurality of second inner leads 11b, i.e., so as to extend across the second inner leads 11b, and one of the lead fixing tapes 20 overlaps one side, along which a plurality of bonding pads are arranged, of the element formation surface of a semiconductor chip 10. In addition, the other one of the lead fixing tapes 20 overlaps a side, which is opposite to the side along which the bonding pads are arranged, of the element formation surface of the semiconductor chip 10. Since the rest of the structure is the same as the third embodiment, the same reference numerals as in FIGS. 5 and 6 denote the same parts.

With this arrangement, basically the same effects as the semiconductor device of the third embodiment can be obtained. Also, the pair of lead fixing tapes 20 are present below the lower surface of the semiconductor chip 10. When the semiconductor chip 10 undergoes die bonding, it is possible to disperse the pressure applied on the second inner leads 11b, and stably fix the semiconductor chip 10 on the second inner leads 11b.

Second Modification of Third Embodiment

Figure 9:
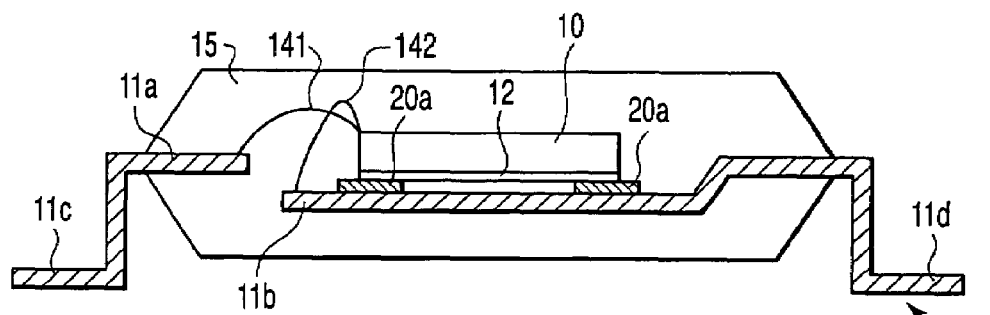
FIG. 9 is a sectional view of a semiconductor device according to the second modification of the third embodiment of the present invention.
Figure 10:
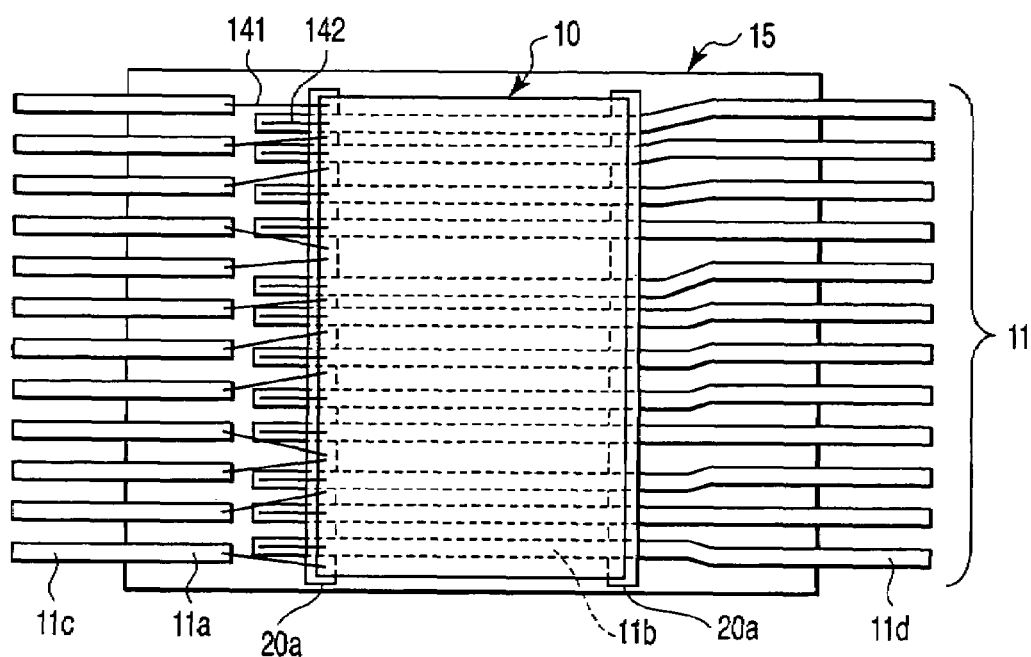
FIG. 10 is a partially perspective plan view of the semiconductor device shown in FIG. 9.

FIG. 9 is a sectional view schematically showing a semiconductor device having a TSOP structure according to the second modification of the third embodiment. FIG. 10 is a partially perspective plan view schematically showing the semiconductor device shown in FIG. 9.

This semiconductor device shown in FIGS. 9 and 10 differs from the third embodiment described above in that a pair of lead fixing tapes 20a are adhered in a direction perpendicular to the longitudinal direction of a plurality of second inner leads 11b, i.e., so as to extend across the second inner leads 11b, and, on the upper surfaces, i.e., the chip mounting surfaces of the second inner leads 11b, at least portions of the lead fixing tapes 20a overlap the chip lower surface. Since the rest of the structure is the same as the third embodiment, the same reference numerals as in FIGS. 5 and 6 denote the same parts.

With this arrangement, basically the same effects as the semiconductor device of the third embodiment can be obtained.

Fourth Embodiment

Figure 11:
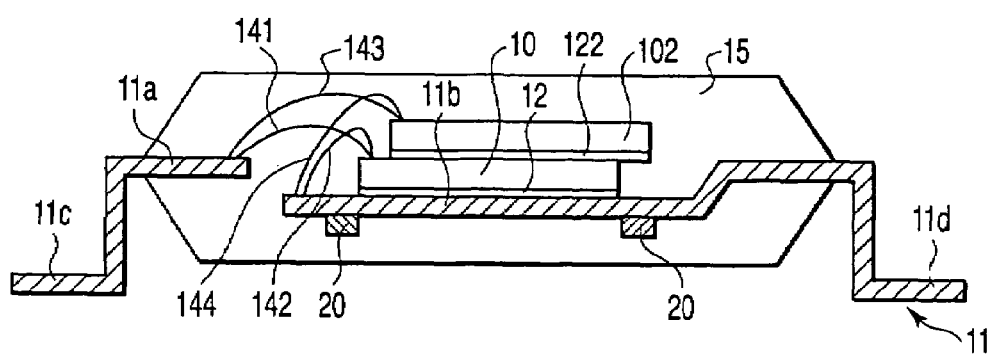
FIG. 11 is a sectional view of a semiconductor device according to the fourth embodiment of the present invention.

FIG. 11 is a sectional view schematically showing a semiconductor device having a TSOP structure according to the fourth embodiment of the present invention. This semiconductor device shown in FIG. 11 differs from the semiconductor device of the third embodiment described above in that two semiconductor chips 10 and 102 of the same type and/or the same size are stacked via an insulating adhesive such that their bonding pad arrangement portions are close to and shifted from each other. Since the rest of the structure is the same, the same reference numerals as in FIG. 5 denote the same parts.

Referring to FIG. 11, a first semiconductor chip 10 in which a plurality of first bonding pads (equivalent to 13 in FIG. 3A) are collectively arranged on one side is mounted, via a thin organic insulating film 12 on the lower surface of the chip, on die lead portions made of a plurality of second inner leads 11b of a lead frame 11. A second semiconductor chip 102 has a plurality of second bonding pads (equivalent to 13 in FIG. 3A) collectively arranged along one side of the element formation surface. Also, the second semiconductor chip 102 is stacked on the element formation surface of the first semiconductor chip 10 via an insulating adhesive 102, such that the positions of the second bonding pads are shifted from the first bonding pads in a direction parallel to the direction in which the first and second bonding pads are arranged, and the first bonding pads are exposed. In the same manner as shown in FIG. 4, first inner leads 11a and the second inner leads 11b are electrically connected to the first and second bonding pads on the first and second semiconductor chips 10 and 102, respectively, by a first bonding wire group made up of a plurality of first bonding wires 141, a second bonding wire group made up of a plurality of second bonding wires 142, a third bonding wire group made up of a plurality of third bonding wires 143, and a fourth bonding wire group made up of a plurality of fourth bonding wires 144.

The COL-structure semiconductor device shown in FIG. 11 achieves the same effects as in the third embodiment. In addition, a high-density package can be obtained by stacking chips.

Note that in each of the above embodiments, of a plurality of bonding pads on a semiconductor chip, I/O pads for inputting and outputting signals are connected by wire bonding to the first inner leads 11a and the second inner leads 11b.

Fifth Embodiment

Figure 12A:
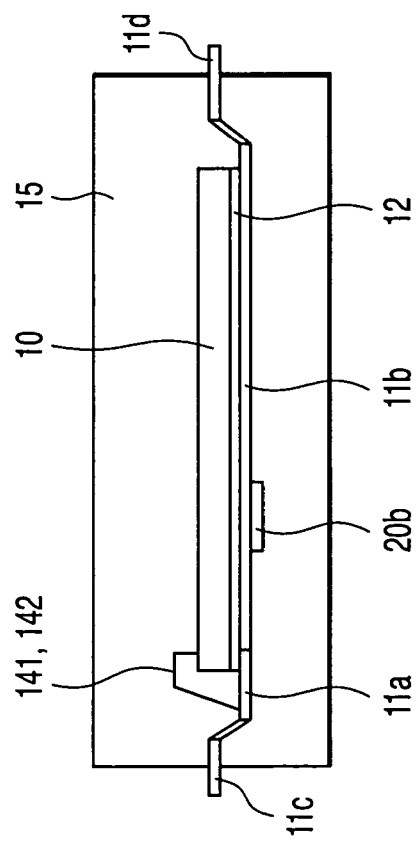
FIG. 12A is a sectional view of a semiconductor device according to the fifth embodiment of the present invention.
Figure 12B:
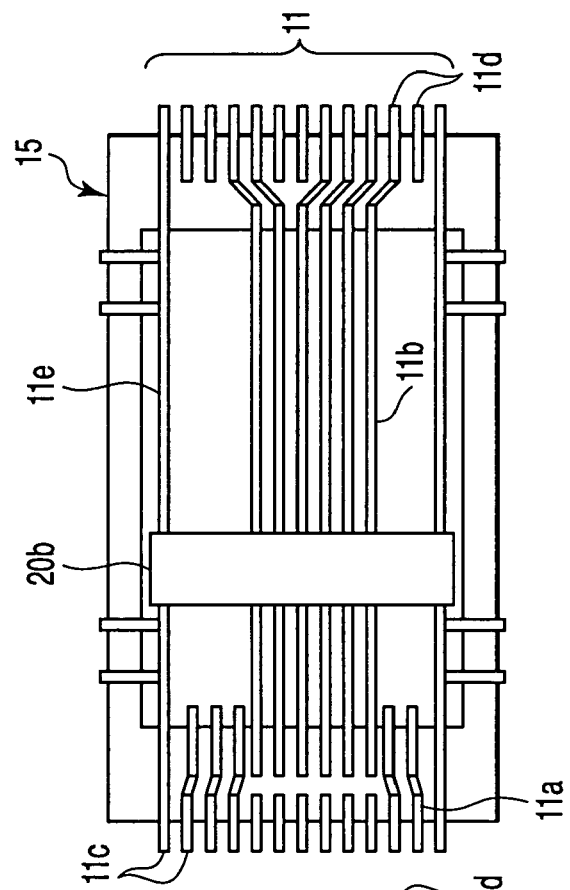
FIG. 12B is a partially perspective top view of the semiconductor device shown in FIG. 12A.
Figure 12C:
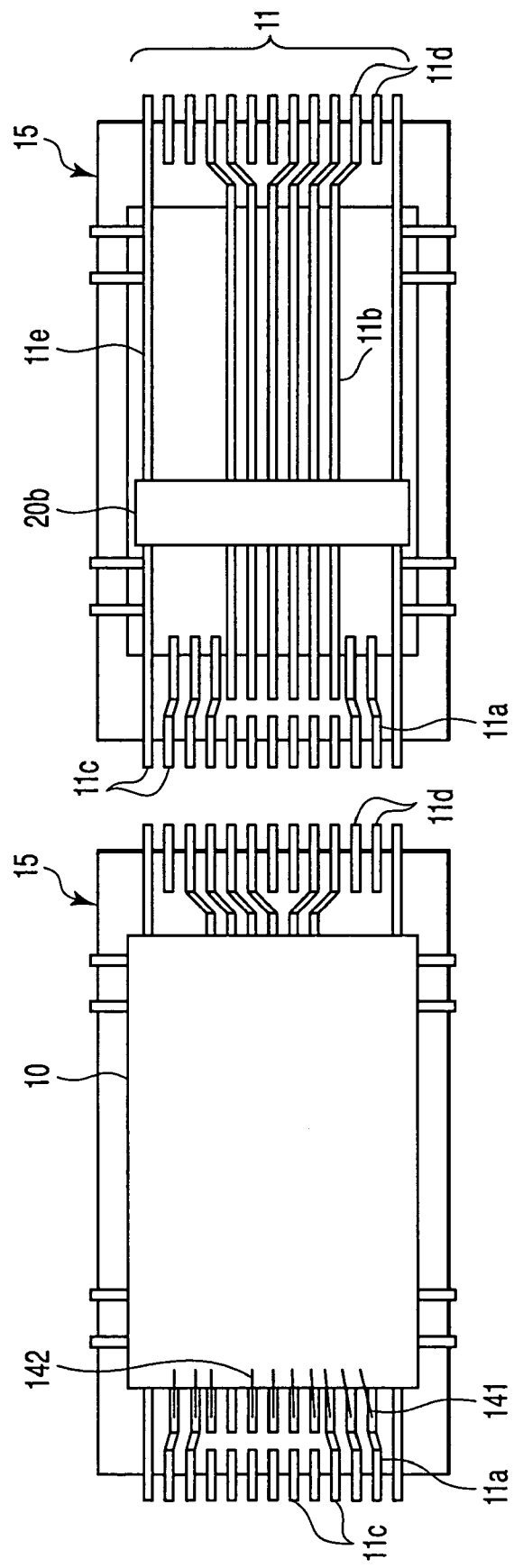
FIG. 12C is a partially perspective bottom view of the semiconductor device shown in FIG. 12A.

FIG. 12A is a side view schematically showing the sectional structure of a semiconductor device having a TSOP structure according to the fifth embodiment. FIGS. 12B and 12C are partially perspective top and bottom views, respectively, schematically showing the semiconductor device.

This semiconductor device shown in FIGS. 12A, 12B, and 12C differs from the third embodiment in that similar to a plurality of second inner leads 11b, a plurality of first inner leads 11a are also bent halfway, and a wide lead fixing tape 20b is used as a lead fixing tape and adhered such that their two ends extend to a pair of suspension pins 11e of a lead frame 11. Since the rest of the structure is the same, the same reference numerals as in FIGS. 5 and 6 denote the same parts.

With this arrangement, it is possible to stably support the lead fixing tape 20b by the pair of suspension pins 11e, and stably support the second inner leads 11b.

First Application Example

Figure 13:
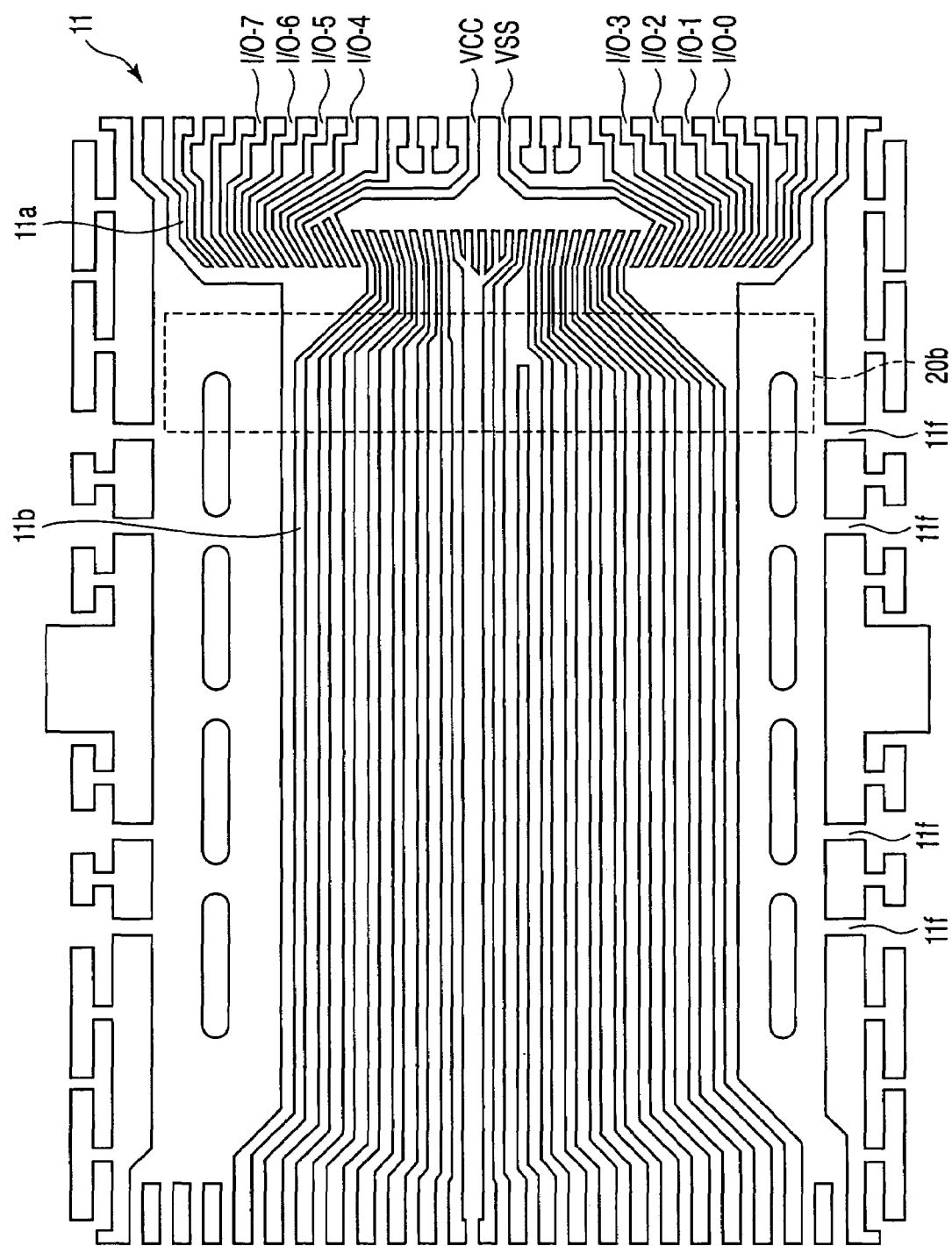
FIG. 13 is a plan view showing an example of a lead frame when the semiconductor device of the present invention is applied to a memory integrated circuit device.

FIG. 13 is a plan view showing examples of a lead frame and the arrangement of external terminals corresponding to the lead frame when the semiconductor device of the present invention is applied to a memory integrated circuit device, e.g., a NAND flash memory. Compared to the lead frame explained in each of the above embodiments, in this lead frame the positions of first and second inner leads 11a and 11b are switched in the lateral direction.

In a lead frame 11 shown in FIG. 13, the distal end portions of a plurality of second inner leads 11b are intensively arranged in a central portion in the widthwise direction of the arrangement of the inner leads, and the distal end portions of a plurality of first inner leads 11a are separately arranged on the two sides, i.e., on the outsides in the widthwise direction of the arrangement of the second inner leads 11b. The first inner leads 11a are thus preferably arranged on the outsides because it is difficult to abruptly bend the first inner leads 11a as they are laid out during the manufacture. The second inner leads 11b have a high degree of freedom of layout, so they are arranged in the central portion as described above.

The distal end portions of the first inner leads 11a connecting to 8-bit input/output external terminals I/O-0 to I/O-7 are connected by wire bonding to a plurality of bonding pads on a semiconductor chip mounted on the second inner leads 11b.

Second Application Example

Figure 14:
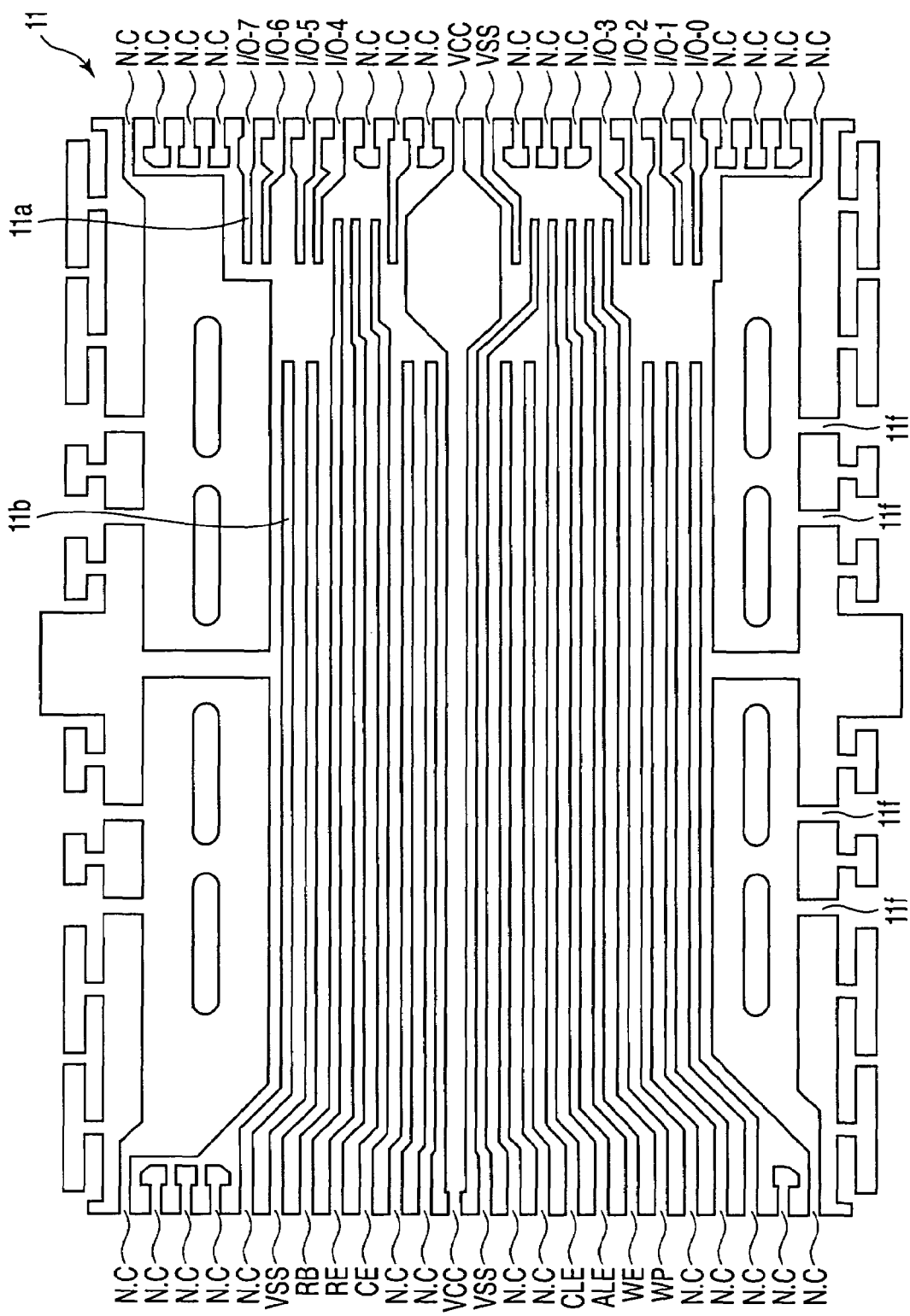
FIG. 14 is a plan view showing another example of the lead frame when the semiconductor device of the present invention is applied to a memory integrated circuit device.

FIG. 14 is a plan view showing other examples of a lead frame and the arrangement of external terminals corresponding to the lead frame when the semiconductor device of the present invention is applied to a memory integrated circuit device, e.g., a NAND flash memory. Compared to the lead frame explained in each of the above embodiments, in this lead frame the positions of first and second inner leads 11a and 11b are switched in the lateral direction.

In a lead frame 11 shown in FIG. 14, a plurality of first inner leads 11a and a plurality of second inner leads 11b are divided into two, upper and lower portions. The distal end portions of the second inner leads 11b are intensively arranged in a central portion in the widthwise direction of the arrangement of the inner leads, and the distal end portions of the first inner leads 11a are separately arranged on the two sides, i.e., on the outsides in the widthwise direction of the arrangement of the second inner leads 11b. The first inner leads 11a connecting to 8-bit input/output external terminals I/O-0 to I/O-7 form inner lead groups close to pads 13, and are connected by wire bonding to a plurality of bonding pads on a semiconductor chip mounted on the second inner leads 11b.

The external terminals shown in FIG. 14, other than I/O-0—I/O-7, VCC and VSS, will be described. 'N.C' is a non-connection terminal. "RB" is an output terminal for outputting a read/busy signal used to inform the outside of the internal operation state of the device. 'RE' is an input terminal for receiving a read enable signal used to serially output data. 'CE' is an input terminal for receiving a chip enable signal as a device selection signal. 'CLE' is an input terminal for receiving a command latch enable signal used to control the fetching of an operation command into the command register of the device. 'ALE' is an input terminal for receiving a signal used to control the fetching of address data and input data into the address register and data register of the device. 'WE' is an input terminal for receiving a write enable signal used to control the fetching, into the device, of data input to I/O-0~I/O-7. 'WP' is an input terminal for receiving a write protect signal used to forcibly inhibit writing and erasing operations Modification of Lead Frame of Each Embodiment As a lead frame of each embodiment, as shown in FIGS. 13 and 14, it is preferable to increase the lead width of outermost inner leads of the first and second inner leads 11a and 11b, and connect these outermost inner leads to suspension pins 11f on the side surfaces of the lead frame 11, i.e., connect the suspension pins to each other inside the package to increase the size of the connected portions, thereby increasing the area which supports a chip when it is mounted. Compared to the structure in which a chip is supported only by the second inner leads 11b, it is possible to suppress flexing of the distal end portions of the second inner leads 11b when a chip is mounted, and prevent deformation of the inner leads 11b by the weight of the chip.

Sixth Embodiment

FIG. 15 is a sectional view schematically depicting a semiconductor device of TSOP structure, which is the sixth embodiment of the present invention. A schematic plan view of the semiconductor device sown in FIG. 15, as viewed from the lower surface of the resin package, is similar to the plan view of FIG. 2. The device of FIG. 15 has a semiconductor chip 10 that has pads provided on one edge. The pads are laid out as shown in the plan view of FIG. 3A. An insulating adhesive film (i.e., organic insulating film) is adhered to the lower surface of the chip, as is illustrated in the plan view of FIG. 3B.

The lead frame 11 of the semiconductor device has two groups of first inner leads, two groups of outer leads, and suspension pins (not shown). The first inner-lead group consists of a plurality of first inner leads 11a that extend parallel to one another. The second inner-lead group consists of a plurality of second inner leads 11b that extend parallel to one another. The second inner leads 11b face the distal ends of the first inner leads 11a, respectively. The first outer-lead group consists of a plurality of first outer leads 11c that are formed integral with the first inner leads 11a, respectively. The second outer-lead group consists of a plurality of second outer leads 11d that are formed integral with the second inner leads 11b, respectively. The first inner leads 11a are different in length from the second inner leads 11b. The first inner leads 11a and second inner leads 11b are arranged in the same plane. Their middle parts, for example, constitute a die-lead section (i.e., chip-holding section).

Neither the first inner leads nor the second inner leads are depressed. Thus, they have no stepped portions. Namely, they are flat.

The semiconductor chip 10 has bonding pads 13. The bonding pads 13 are densely provided on one edge of the element formation surface. A thin organic insulating film 12 that is, for example, 20 to 40 μm thick, adheres to the lower surface of the chip 10. The organic insulating film 12 is made of, for example, polyimide-based epoxy resin. The chip 10 is mounted on the die-lead section constituted by the second inner leads 11b, with the organic insulating film 12 contacting the second inner leads 11b. The chip 10 is so oriented that the bonding pads are near the first inner leads 11a, i.e., shorter inner leads that do not support the chip 10. In other words, the distal end of each first inner lead 11a (i.e., shorter inner lead) is opposed to a bonding pad. The second inner leads 11b, i.e., longer inner leads, extend on the lower surface of the chip 10, each having its distal end located between one bonding pad and one first inner lead 11a (i.e., shorter inner lead).

The organic insulating film 12 ensures insulation between the die-lead section and the lower surface of the chip 10. The organic insulating film 12 may be a residual part of the insulating adhesive was applied to the lower surface of a wafer in the scribing process performed to cut the chip 10 from the wafer.

First bonding wires 141 connect some of the bonding pads to the first inner leads 11a (i.e., shorter inner leads), not supporting the chip 10 and located near the bonding pads of the chip 10.

Second bonding wires 142 connect the remaining bonding pads to the distal ends of the second inner leads 11b (i.e., longer inner leas) that support the chip 10.

Resin 15 encapsulates the first inner leads 11a, second inner leads 11b, chip 10 and bonding wires 141 and 132, thus forming a resin package. The resin package is composed of two halves. The first half lying on the chip-supporting surface of the lead frame 11 is thicker than the second half lying on the other surface of the lead frame 11. Thus, the chip 10 exits in that part of the resin package, which is middle in the direction of thickness of the package.

The first outer leads 11c extend outward from the first inner leads 11a, at one side of the resin package. The second outer leads 11d extend outward from the second inner leads 11b, at the opposite side of the resin package. Hence, each of the outer leads 11c and 11d extends at a position deviated from that part of package, which is middle in the direction of thickness thereof. Each outer lead is bent, extending along one side of the chip 10, and bent again toward the chip-supporting surface of the lead frame 11. Further, its distal end portion is bent away from the resin package and is used as an external terminal. Thus, the chip 10 is encapsulated in the resin package, in a face-down state.

The semiconductor device shown in FIG. 15 has chip-on-lead (COL) structure. That is, the chip 10 is mounted on the second inner leads 11b (i.e., longer inner leads), the bonding wires 141 connect the first inner leads 11a to some of the bonding pads, and bonding wires 142 connect the second inner leads 11b to the remaining bonding pads. The COL structure differs from the conventional lead-on-chip structure in which leads are provided above and below the chip. It has one lead frame only, whereas lead-on-chip structure has two lead frames. Hence, the device of FIG. 15 is easy to manufacture. The device of FIG. 15 is easy to manufacture, also because the first inner leads 11a and second inner leads 11b are arranged in the same plane and are not depressed at all.

The chip 10 is mounted on and adhered to the die-lead section constituted by the middle parts of the second inner leads 11b (i.e., longer inner leads), and the bonding pads of the chip 10 are wire-bonded to the distal ends of the first and second inner leads 11a and 11b. Therefore, the bonding wires can be short. The shorter the bonding wires, the lower the possibility that the bonding wires are cut or short-circuited when the resin flows in the process of encapsulating the chip 10. This enhances the reliability of the semiconductor device.

As indicated above, the first half of the resin package, which lies on the chip-supporting surface of the lead frame 11, is thicker than the second half that lies on the other surface of the lead frame 11. Thus, the chip 10 is encapsulated in that part of the resin package, which is middle in the thickness direction of the package.

Each of the outer leads 11d and 11d extends outwards from one side of the resin package and is bent, extending along one side of the chip 10 toward the chip-supporting surface of the lead frame 11. Further, the chip 10 is encapsulated in the resin package, in a face-down state. Hence, the second inner leads 11b lie between the chip 10 and a laser beam which is applied to the upper surface of the package (i.e., the surface close to the other surface of the lead frame) to achieve marking while the semiconductor device is being assembled. Thus, the laser beam does not pass through the resin molding, never reaching the semiconductor chip 10. Therefore, the beam would not damage the chip 10. Nor would the beam be applied to the bonding wires, never cutting the bonding wires.

In this embodiment and the other embodiments, the semiconductor chip 10 has bonding pads arranged on only one edge of the element formation surface. The chip 10 can therefore be smaller than otherwise. A memory chip having of large storage capacity, e.g., a NAND flash memory chip, has a surface area, which depends on how the circuit wiring is designed in accordance with the layout of the circuits peripheral to the memory cells. The chip 10 has a small surface area, because the pads are provided on only one edge of one surface and the circuit wiring is therefore rational. This embodiment and the other embodiments are therefore fit for NAND flash memories of large storage capacity, which should be provided in the form of inexpensive, multi-layer packages. The How peripheral circuits are laid out in an NAND flash memory chip having pads on one surface only will be described later.

Since the first inner leads 11a and second inner leas 11b are set at the power-supply potential or the ground potential, they must be insulated from the semiconductor chip 10. To this end, not only a mounting film of electrically insulating material, but also an organic insulating film provided on the lower surface of the chip is used, accomplishing reliable electrical insulating between the semiconductor chip 10 and the second inner leads 11b.

A thin insulating adhesive film 12, which is laid on the lower surface of the die-lead section, adheres the chip 10 to the die-lead section. This helps to provide a semiconductor device of TSOP structure. The difference in height between the chip upper surface and the distal end portions of the first and second inner leads 11a and 11b can therefore be small. Thus, it is easy to perform wire bonding. In addition, the chip 10 can be a large one, because the bonding wires are provided at only one edge of the chip 10 mounted on the second inner leads 11b of the lead frame 11.

Of the bonding pads of the semiconductor chip 10, the input/output pads receive and output signals. The input/output pads are wire-bonded to the first inner leads 11a and the second inner leads 11b.

Seventh Embodiment

FIG. 16 is a sectional view of a semiconductor device of TSOP structure, which is the seventh embodiment of this invention. The semiconductor device shown in FIG. 16 differs from the sixth embodiment, in that two semiconductor chips 10 and 102 of the same type and/or the same size. The chips 10 and 102 are provided at one surface of the lead frame 11, laid one upon another in staggered fashion with an insulating adhesive film 122 interposed between them. The chips 10 and 102 are so arranged that the pads of one chip are close to those of the other pad. In any other respects, the seventh embodiment is identical to the sixth embodiment. In FIG. 16, the components identical to those of the sixth embodiment are designated at the same reference numerals in FIG. 15.

As FIG. 16 shows, the first semiconductor chip 10 has a plurality of first bonding pads that are identical to the bonding pads 13 shown in FIG. 3. The chip 10 is mounted on the die-lead section of the second inner leads 11b. More correctly, mounting agent adheres the chip 10 to a thin organic insulating film 12 that is provided on the die-lead section. The second semiconductor chip 102 is similar in structure and has a plurality of second bonding pads. The second bonding pads lie near the first bonding pads provided on the first semiconductor chip 10. The second semiconductor chip 102 is mounted on an insulating adhesive film 122, which is provided on the first semiconductor chip 10. The second semiconductor chip 102 is so positioned that the row of its bonding pads is staggered with respect to the row of the bonding pads of the first semiconductor chip 10. The bonding pads of the first and second chips 10 and 102 are connected to the first inner leads 11a and second inner leads 11b, by four groups of bonding wires.

The first group consists of first bonding wires 141. The first bonding wires 141 connect the distal ends of some of the first inner leads 11a that do not support the first chip 10, to some of the first bonding pads provided on the first chip 10.

The second group consists of second bonding wires 142. The second bonding wires 142 connect the distal ends of some of the second inner leads 11b that support the first chip 10, to the remaining first bonding pads provided on the first semiconductor chip 10.

The third group consists of third bonding wires 143. The third bonding wires 143 connect the distal ends of the remaining first inner leads 11a that do not support the first chip 10, to some of the second bonding pads provided on the second semiconductor chip 102.

The fourth group consists of fourth bonding wires 144. The fourth bonding wires 144 connect the distal ends of some of the second inner leads 11b that support the first chip 10, to the remaining second bonding pads provided on the second semiconductor chip 102.

Resin 15 encapsulates the first inner leads 11a and second inner leads 11b of the read frame 11, insulating resin films 12 and 122, both chips 10 and 102 and boding wires 141 to 144. A resin package is thereby formed. First outer leads 11c are formed integral with the first inner leads 11a, and second outer leads 11d formed integral with the second inner leads 11b. The first outer leads 11c and second outer leads 11d are exposed, on at least two opposite edges of the resin package. The first outer leads 11c and second outer leads 11d are used as external terminals.

The semiconductor device of FIG. 16 has COL structure. It achieves the same advantages as the first embodiment described above. As specified already, the first semiconductor chip 10 is adhered to those parts of the second inner leads 11b, which are middle in the lengthwise direction. The second semiconductor chip 102 is adhered to the first chip 10 and staggered in horizontal plane, with respect to the firs semiconductor chip 10. The bonding pads on the two chips 10 and 102 are wire-bonded to the distal ends of the first inner leads 11a and second inner leads 11b. Since the inner leads 11a and 11b are located near the bonding pads, the bonding wires can be short. The shorter the bonding wires, the lower the possibility that the bonding wires are cut or short-circuited when the resin flows when the chips 10 and 102 are encapsulated after the wire bonding is carried out. This enhances the reliability of the semiconductor device. Moreover, the semiconductor device can easily have TSOP structure. This is because a thin insulating adhesive film 12 is provided on the second inner leads 11b and adheres the first chip 10 to the lead frame 11. Further, the wire bonding can be easily performed, because the difference in height between the upper surface of the chip 10 and the distal end portions of the inner leads 11a and 11b is small as mentioned above. Still further, the semiconductor device has high integration density because the semiconductor chips 10 and 102 are laid one upon the other.

Eighth Embodiment

The eighth embodiment differs from the sixth embodiment in two respects. First, the second inner leads 11b, i.e., longer inner leads, assumes a different relative position. Second, adhesive tapes 20 are laid on the second inner leads 11b, preventing the distal end portions o the leads 11b from contacting one another.

FIG. 17 is a sectional view of a semiconductor device of TSOP structure, which is the eighth embodiment of the present invention. A schematic plan view of the semiconductor device sown in FIG. 17, as viewed from the lower surface of the resin package, is similar to the plan view of FIG. 6.

The semiconductor device of FIG. 17 differs from the device according to the sixth embodiment, in that two tapes 20 are adhered to the second inner leads 11b (i.e., longer inner leads) and extend at right angles thereto. The tapes 20 are made of polyimide and coated with electrically insulating adhesive. They are located outside the two opposite sides of the semiconductor chip 10, as viewed from above. In any other respects, the device of FIG. 17 is identical to the device according to the sixth embodiment. In FIG. 17, the components identical to those of the sixth embodiment are designated at the same reference numerals in FIG. 15.

The semiconductor device shown in FIG. 17 has COL structure. It achieves the same advantages as the first embodiment described above. The tapes 20 are adhered to the lead frame 11, more precisely to the second inner leads 11b (i.e., longer inner leads), preventing each second inner lead 11b being displaced from any other, or preventing the distal end portions of the second inner leads 11b from contacting one another. To accomplish reliable wire bonding, at least one of the tapes 20 holding the second inner leas 11b should be adhered to the distal end portions of the second inner leads 11b.

The use of the tapes 20 to hold the second inner leads 11b may impair the resin capsulation of the chip 10 or raise the manufacturing cost of the semiconductor device. In this case, the tapes 20 can be dispensed with.

First Modification of the Eight Embodiment

FIG. 18 is a sectional view of a semiconductor device of TSOP structure, which is a first modification of the eighth embodiment of the present invention. A schematic plan view of the semiconductor device sown in FIG. 18, as viewed from the lower surface of the resin package, is similar to the plan view of FIG. 8.

The semiconductor device depicted in FIG. 18 differs from the eighth embodiment described above, only in that the lead fixing tapes 20, which are provided on the second inner leads 11b and coated with insulating adhesive, are located, at least in part, inside the opposite side of the semiconductor chip 10 as viewed from above. In any other respects, the modification is identical to the eighth embodiment. In FIG. 18, the components identical to those of the sixth embodiment are designated at the same reference numerals.

The first modification shown in FIG. 18 attains the same advantages as the eighth embodiment. The first modification is also advantageous in that the second inner leads 11b are firmly secured. This is because the lead fixing tapes 20, which lies above the lower surface of the chip 10, disperses the pressure that is exerted on the second inner leads 11b in the process of wire-bonding the chip 10 to the lead frame 11.

Second Modification of the Eighth Embodiment

FIG. 19 is a sectional view of a semiconductor device of TSOP structure, which is a second modification of the eighth embodiment. A schematic plan view of the semiconductor device sown in FIG. 19, as viewed from the lower surface of the resin package, is similar to the plan view of FIG. 10.

The semiconductor device depicted in FIG. 19 differs from the eighth embodiment described above, in two respects only. First, the lead fixing tapes 20, which are coated with insulating adhesive, are provided on the chip mounting surfaces of the second inner leads 11b. Second, the tapes 20 located, at least in part, inner of the opposite side of the semiconductor chip 10 as viewed from above. In any other respects, the modification is identical to the eighth embodiment. In FIG. 19, the components identical to those of the sixth embodiment are designated at the same reference numerals. In this modification, lead fixing tapes 20a are thin. The difference in height between the upper surface of the chip 10 and the distal end portions of the inner leads 11a and 11b is therefore small. This helps to facilitate the wire bonding.

Ninth Embodiment

FIG. 20 is a sectional view of a semiconductor device of TSOP structure, which is the ninth embodiment of this invention. A schematic plan view of the semiconductor device sown in FIG. 20, as viewed from the lower surface of the resin package, is similar to the plan view of FIG. 17. The semiconductor device of FIG. 20 differs from the ninth embodiment, in that two semiconductor chips 10 and 102 of the same type and/or the same size. The chips 10 and 102 are provided at one surface of the lead frame 11, laid one upon another in staggered fashion with an insulating adhesive film 122 interposed between them. The chips 10 and 102 are so arranged that the pads of one chip are close to those of the other pad. In any other respects, the ninth embodiment is identical to the eighth embodiment. In FIG. 20, the components identical to those of the eighth embodiment are designated at the same reference numerals in FIG. 17.

As FIG. 20 shows, the first semiconductor chip 10 has a plurality of first bonding pads that are identical to the bonding pads 13 shown in FIG. 3. The chip 10 is mounted on the die-lead section of the second inner leads 11b, i.e., the longer inner leads. More correctly, the chip 10 is adhered to the die-lead section by a thin organic insulating film 12 that is provided on lower surface of the die-lead section. The second semiconductor chip 102 is similar in structure and has a plurality of second bonding pads. The second bonding pads lie near the first bonding pads provided on the first semiconductor chip 10. The second semiconductor chip 102 is mounted on an insulating adhesive film 122, which is provided on the first semiconductor chip 10 and made of mounting agent or film material. The second semiconductor chip 102 is so positioned that the row of its bonding pads is staggered with respect to the row of the bonding pads of the first semiconductor chip 10. The bonding pads of the first and second chips 10 and 102 are connected to the first inner leads 11a and second inner leads 11b, by four groups of bonding wires, i.e., first bonding wires 141, second bonding wires 142, third bonding wires 143 and fourth bonding wires 144, as in the semiconductor device of FIG. 16.

Resin 15 encapsulates the first inner leads 11a and second inner leads 11b of the read frame 11, insulating resin films 12 and 122, both chips 10 and 102 and boding wires 141 to 144. A resin package is thereby formed. First outer leads 11c are formed integral with the first inner leads 11a, and second outer leads 11d formed integral with the second inner leads 11b. The first outer leads 11c and second outer leads 11d are exposed, on at least two opposite edges of the resin package. The first outer leads 11c and second outer leads 11d are used as external terminals.

The semiconductor device of FIG. 20 has COL structure. It achieves the same advantages as the third embodiment described above. In addition, the semiconductor device has high integration density because the semiconductor chips 10 and 102 are laid one upon the other.

In each of the embodiments described thus far, some of the bonding pads are used as input/output pads that receive and output signals. The input/output pads are wire-bonded to the inner leads.

Tenth Embodiment

Figure 21B:
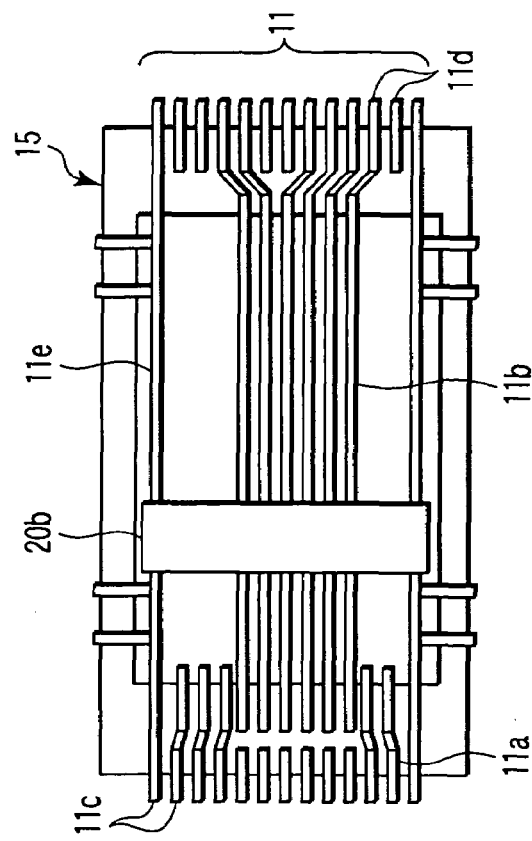
FIG. 21B is a bottom view of the semiconductor device according to the tenth embodiment.
Figure 21A:
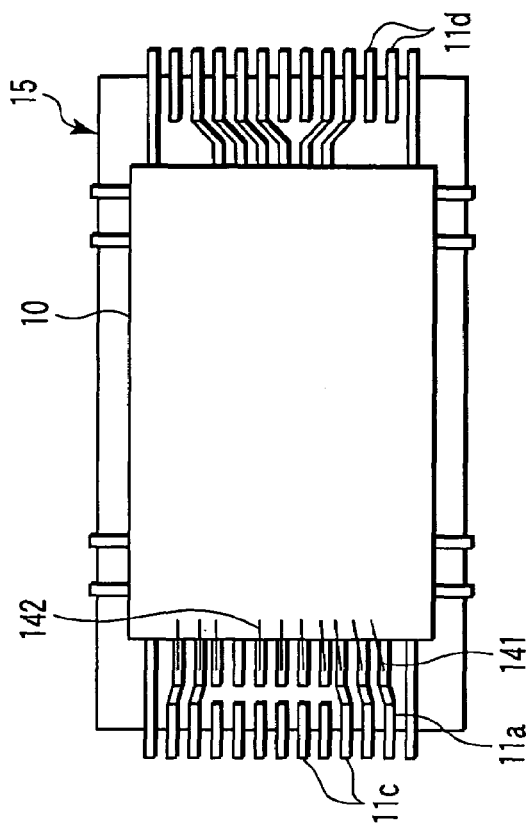
FIG. 21A is a top view of a semiconductor device according to the tenth embodiment of this invention.

FIGS. 21A and 21B are a top view and a bottom view, respectively, showing a semiconductor device of TSOP structure, which is the tenth embodiment of this invention, as viewed from the lower surface of the resin package.

The semiconductor device shown in FIGS. 21A and 21B differs from the eighth embodiment in that one broad lead-fixing tape 20b is used. The tape 20b extends, with its ends adhered to two suspension pins lie, respectively. In any other respects, the tenth embodiment is identical to the eighth embodiment. In FIGS. 21A and 21B, the components identical to those of the eighth embodiment are designated at the same reference numerals as in FIG. 17.

The suspension pins 11e stably support the lead fixing tape 20b. Thus supported, the tape 20b can stably support the second inner leads 11b.

The sixth to tenth embodiments described above may be applied to, for example, NAND flash memories. If this is the case, the lead frame shown in FIG. 13 or the lead frame shown in FIG. 14 can be utilized.

Figure 22:
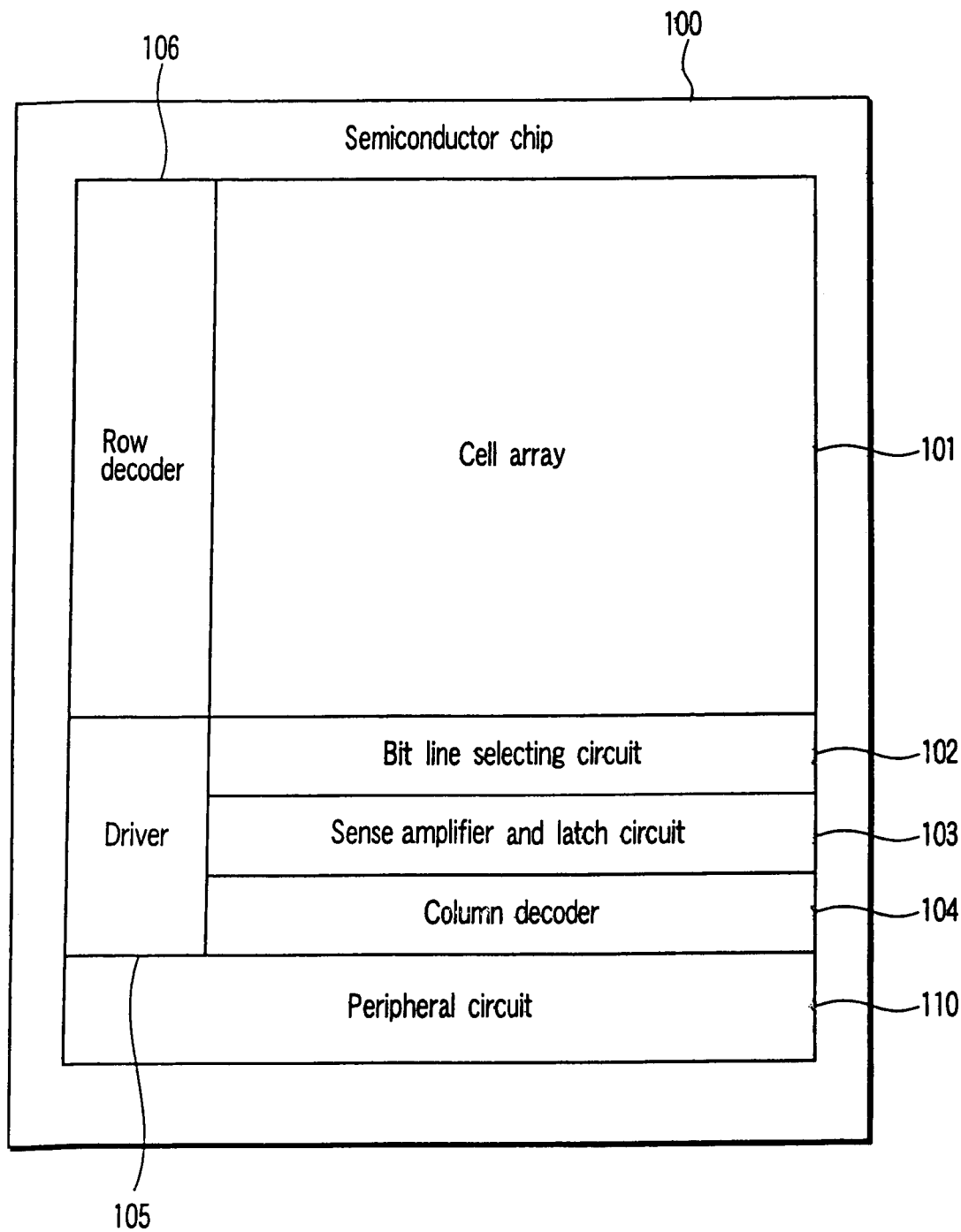
FIG. 22 is a plan view of a NAND flash memory according to this invention, illustrating the layout of components of the flash memory.

FIG. 22 is a plan view of a semiconductor chip that incorporates a NAND flash memory according to this invention, which has pads on one surface. More precisely, FIG. 22 illustrates the component layout of the semiconductor chip.

As FIG. 22 shows, the semiconductor chip 100 incorporates a cell array 101, a bit-line selecting circuit 102, a sense amplifier/latch circuit 103, a column decoder 104, a driver 105, a row decoder 106, and a peripheral circuit 110.

The cell array 101 comprises memory cells, word lines, arranged in rows and columns, forming a cell matrix, selection-gate lines, bit lines, and a shield power supply. The memory cells are arranged in rows and columns, forming a cell matrix. The word lines and selection-gate lines extend parallel to the rows of memory cells. The bit lines extend parallel to the columns of memory cells. The shield power supply applies potential to shield any odd-numbered bit line from the adjacent even-numbered bit line.

The bit-line selecting circuit 102 is provided at one side of the cell array 101 and extends in the column direction thereof. The sense amplifier/latch circuit 103 and column decoder 104 extend along the bit-line selecting circuit 102, also in the column direction of the cell array 101. The row decoder 106 is arranged at one side of the cell array 101 and extends in the row direction thereof. The driver 105 is located adjacent to the bit-line selecting circuit 102, sense amplifier/latch circuit 103, column decoder 104 and row decoder 106. Like the row decoder 106, the driver 105 extends in the row direction of the cell array 101. The peripheral circuit 110 is arranged adjacent to the column decoder 104 and driver 105 and extends in the column direction of the cell array 101. Since only one driver 105 is used to drive the bit-line selecting circuit 102, the semiconductor chip 100 has higher integration density and fewer components than otherwise.

The sense amplifier/latch circuit 103 amplifies and latches the data read from the memory cells through the bit lines. The bit-line selecting circuit 102 connects the even-numbered bit lines to the shield power supply when the odd-numbered bit lines are connected to the sense amplifier/latch circuit 103. When the even-numbered bit lines are connected to the sense amplifier/latch circuit 103, the odd-numbered bit lines are connected to the shield power supply. Thus, the bit-line selecting circuit 102 performs two functions. Its first function is to select and connect bit lines to the sense amplifier/latch circuit 103. Its second function is to connect the unselected bit lines to the shield power supply. Therefore, the semiconductor chip 100 has higher integration density and fewer components than in the case where two circuits that performs said two functions, respectively, are used in place of the bit-line selecting circuit 102.

How data is read from the NAND flash memory incorporated in the semiconductor chip 100 will be described. The row decoder 106 selects one of cell blocks of the cell array 101 and one of the word lines, in accordance with a block-address signal and a row-address signal. The driver 105 drives the row decoder 106, which applies potential Vsg of, for example, 3.5 V. to any selected gate in the selected cell block and applies ground potential GND to any unselected gate in any unselected cell block. Further, to read data, the driver 105 drives the row decoder 106, which applies ground potential GND to any word line and potential Vs of, for example, 3.5 V to any unselected word line.

The column decoder 104 one of the bit lines in accordance with a column-address signal supplied from the address buffer provided in the peripheral circuit 110. The sense amplifier/latch circuit 103 amplifies and latches the data read from the selected bit line and input via the bit-line selecting circuit 102. The data latched by the circuit 103 is output via the column decoder 104 to the I/O buffer that is incorporated in the peripheral circuit 110.

Additional advantages and modifications will readily occur to those skilled in the art. Therefore, the invention in its broader aspects is not limited to the specific details and representative embodiments shown and described herein. Accordingly, various modifications may be made without departing from the spirit and scope of the general inventive concept as defined by the appended claims and their equivalents. For example, the present invention is applicable not only to the TSOP structure described above, but also to a semiconductor device having a package structure which has external terminals on the four sides.

What is claimed is:

1. A semiconductor device comprising:
   a lead frame having at least a plurality of first inner leads having distal end portions and parallel to each other, and a plurality of second inner leads having distal end portions opposing the distal end portions of the first inner leads, longer than the first inner leads, and parallel to each other;
   a semiconductor chip having an element formation surface and a plurality of bonding pads arranged along one side of the element formation surface, and mounted on surfaces of said plurality of second inner leads using an insulating adhesive;
   a plurality of first bonding wires which electrically connect the distal end portions of said plurality of first inner leads to some of said plurality of bonding pads;
   a plurality of second bonding wires which electrically connect the distal end portions of said plurality of second inner leads to the rest of said plurality of bonding pads; and
   at least one lead fixing tape adhered, across said plurality of second inner leads, on surfaces of said plurality of second inner leads opposite to the surfaces on which the semiconductor chip is mounted, the at least one lead fixing tape overlapping with the semiconductor chip and protruding from the semiconductor chip in a direction to the distal end portions of the plurality of second inner leads in a plane view.

2. The device according to claim 1, further comprising a package which encapsulates said plurality of first inner leads, said plurality of second inner leads, said plurality of first bonding wires, said plurality of second bonding wires, and the semiconductor chip.

3. The device according to claim 1, wherein the semiconductor chip is mounted on said plurality of second inner leads, the distal end portions of said plurality of second inner leads are positioned between the distal end portions of said plurality of first inner leads and said plurality of bonding pads on the semiconductor chip.

4. The device according to claim 1, wherein said plurality of bonding pads include a plurality of first bonding pads which input and output a signal with respect to the semiconductor chip, and said plurality of first bonding pads are electrically connected to the distal end portions of said plurality of second inner leads using said plurality of second bonding wires.

5. The device according to claim 1, wherein said plurality of second inner leads are bent, a plane formed by upper surfaces of said plurality of second inner leads on a surface for mounting the semiconductor chip is lower than a plane formed by upper surfaces of said plurality of first inner leads.

6. The device according to claim 1, further comprising:
   a plurality of first outer leads formed in the lead frame, integrated with said plurality of first inner leads, and extended outside the package; and
   a plurality of second outer leads formed in the lead frame, integrated with said plurality of second inner leads, and extended outside the package.

7. The device according to claim 1, further comprising at least one lead fixing tape adhered, across said plurality of second inner leads, on the surfaces of said plurality of second inner leads on which the semiconductor chip is mounted.

8. The device according to claim 1, wherein lower surfaces of the first inner leads define a flat surface, and lower surfaces of the second inner leads, on which the semiconductor chip is mounted, define a flat surface.

9. The device according to claim 1, wherein outermost inner leads included in the first and second inner leads have a greater width than other inner leads included in the first and second inner leads, and the outermost inner leads are connected to suspension pins on the side surfaces of the lead frame.

10. A semiconductor device comprising:
    a lead frame having at least a plurality of first inner leads having distal end portions and parallel to each other, and a plurality of second inner leads having distal end portions opposing the distal end portions of the first inner leads, longer than the first inner leads, and parallel to each other;
    a first semiconductor chip having an element formation surface and a plurality of first bonding pads arranged along one side of the element formation surface, and mounted on surfaces of said plurality of second inner leads using an insulating adhesive;
    a second semiconductor chip having an element formation surface and a plurality of second bonding pads arranged along one side of the element formation surface, and mounted on the element formation surface of the first semiconductor chip using an insulating adhesive, positions of said plurality of second bonding pads are shifted from said plurality of first bonding pads of the first semiconductor chip in a direction parallel to a direction in which the first and second bonding pads are arranged, and said plurality of first bonding pads are exposed;
    a plurality of first bonding wires which electrically connect the distal end portions of some of said plurality of first inner leads to distal end portions of some of said plurality of first bonding pads;
    a plurality of second bonding wires which electrically connect the distal end portions of the rest of said plurality of first inner leads to some of said plurality of second bonding pads;
    a plurality of third bonding wires which electrically connect the distal end portions of some of said plurality of second inner leads to the rest of said plurality of first bonding pads;
    a plurality of fourth bonding wires which electrically connect the distal end portions of the rest of said plurality of second inner leads to the rest of said plurality of second bonding pads; and
    at least one lead fixing tape adhered, across said plurality of second inner leads, on surfaces of said plurality of second inner leads opposite to the surfaces on which the first semiconductor chip is mounted, the at least one lead fixing tape overlapping with the first semiconductor chip and protruding from the first semiconductor chip in a direction to the distal end portions of the plurality of second inner leads in a plane view.

11. The device according to claim 10, further comprising a package which encapsulates said plurality of first inner leads, said plurality of second inner leads, said plurality of first bonding wires, said plurality of second bonding wires, said plurality of third bonding wires, said plurality of fourth bonding wires, and the first and second semiconductor chips.

12. The device according to claim 10, wherein the first semiconductor chip is mounted on said plurality of second inner leads, the distal end portions of said plurality of second inner leads are positioned between the distal end portions of said plurality of first inner leads and said plurality of bonding pads on the first semiconductor chip.

13. The device according to claim 10, wherein
said plurality of first bonding pads include a plurality of third bonding pads which input and output a signal with respect to the first semiconductor chip, said plurality of third bonding pads are electrically connected to the distal end portions of said plurality of second inner leads using said plurality of third bonding wires,
said plurality of second bonding pads include a plurality of fourth bonding pads which input and output a signal with respect to the second semiconductor chip, and said plurality of fourth bonding pads are electrically connected to the distal end portions of said plurality of second inner leads using said plurality of fourth bonding wires.

14. The device according to claim 10, wherein said plurality of second inner leads are bent, a plane formed by upper surfaces of said plurality of second inner leads on a surface for mounting the first semiconductor chip is lower than a plane formed by upper surfaces of said plurality of first inner leads.

15. The device according to claim 10, further comprising:
a plurality of first outer leads formed in the lead frame, integrated with said plurality of first inner leads, and extended outside the package; and
a plurality of second outer leads formed in the lead frame, integrated with said plurality of second inner leads, and extended outside the package.

16. The device according to claim 10, further comprising at least one lead fixing tape adhered, across said plurality of second inner leads, on the surfaces of said plurality of second inner leads on which the first semiconductor chip is mounted.

17. The semiconductor device according to claim 10, wherein lower surfaces of the first inner leads define a flat surface, and lower surfaces of the second inner leads, on which the first semiconductor chip is mounted, define a flat surface.

18. The device according to claim 10, wherein outermost inner leads included in the first and second inner leads have a greater width than other inner leads included in the first and second inner leads, and the outermost inner leads are connected to suspension pins on the side surfaces of the lead frame.

* * * * *